(12) United States Patent
Shinozaki

(10) Patent No.: US 6,671,788 B2
(45) Date of Patent: Dec. 30, 2003

(54) SYNCHRONOUS SEMICONDUCTOR MEMORY DEVICE HAVING A BURST MODE FOR IMPROVING EFFICIENCY OF USING THE DATA BUS

(75) Inventor: Naoharu Shinozaki, Kawasaki (JP)

(73) Assignee: Fujitsu Ltd., Kawasaki (JP)

( * ) Notice: Subject to any disclaimer, the term of this patent is extended or adjusted under 35 U.S.C. 154(b) by 176 days.

(21) Appl. No.: 09/838,334

(22) Filed: Apr. 20, 2001

(65) Prior Publication Data

US 2001/0047464 A1 Nov. 29, 2001

(30) Foreign Application Priority Data

May 29, 2000 (JP) ........................................ 2000-158319

(51) Int. Cl.[7] .............................................. G06F 12/00
(52) U.S. Cl. ....................................... 711/167; 711/105
(58) Field of Search ................................ 711/105, 167, 711/166, 163; 365/233

(56) References Cited

U.S. PATENT DOCUMENTS 6,356,507 B1 * 3/2002 Kaku et al. .................. 365/233

* cited by examiner

Primary Examiner—Hiep T. Nguyen
(74) Attorney, Agent, or Firm—Arent Fox Kintner Plotkin Kahn

(57) ABSTRACT

A semiconductor memory device has a mask signal receiving circuit which receives a data mask signal, fed from an external unit, out of synchronism and produces an asynchronous internal mask signal. The semiconductor memory device includes a function for interrupting a reading of data during a burst output in response to the data mask signal. The reading of data during the burst output is interrupted by using the internal mask signal. Therefore, the operation time can be shortened when the burst reading is interrupted by a write processing, and thereby the efficiency for using the data bus can be enhanced and the operation can be executed at higher speeds.

8 Claims, 11 Drawing Sheets

SYNCHRONOUS SEMICONDUCTOR MEMORY DEVICE HAVING A BURST MODE FOR IMPROVING EFFICIENCY OF USING THE DATA BUS

BACKGROUND OF THE INVENTION

1. Field of the Invention

The present invention relates to a semiconductor memory device, and more particularly, to a synchronous semiconductor memory device having a burst mode.

2. Description of the Related Art

Recently, in synchronous semiconductor memory devices such as synchronous DRAMs (SDRAMs), signals having phases in synchronism with the external clock signals are fed to plural data output circuits. Further, the SDRAM generally has a burst mode.

When a burst reading is interrupted by a write processing, a controller in the system receives a write command while interrupting the burst output. Specifically, in burst-reading the SDRAM, plural data are continuously output in synchronism with the clock signals, and when a write interrupt is received during the burst reading, the controller in the system receives a write command while interrupting the burst output of the SDRAM.

In the conventional semiconductor memory device, a data mask signal and a burst stop command are received in synchronism with the clock signals. Here, when the operation is interrupted by the write processing, a delay in interrupting the burst output data permits wasteful data to be output onto the data bus and, further, causes a delay in the timing for receiving a write command, resulting in a decrease in the efficiency for using the data bus.

The prior art and the problems associated with the prior art will be described in detail later with reference to accompanying drawings.

SUMMARY OF THE INVENTION

An object of the present invention is to provide a synchronous semiconductor memory device having a burst mode where an operation time is shortened when a burst reading is interrupted by a write processing, to enhance the efficiency for using the data bus, and to execute the operation at higher speeds.

According to the present invention, there is provided a semiconductor memory device having a function for interrupting a reading of data during a burst output in response to a data mask signal fed from an external unit, comprising a mask signal receiving circuit receiving the data mask signal out of synchronism and producing an asynchronous internal mask signal; wherein the reading of data during the burst output is interrupted by using the internal mask signal.

The semiconductor memory device may further comprise a data output circuit producing read data in synchronism with a clock signal, and an output control circuit producing an output control signal upon receiving the internal mask signal and masking the output data from the data output circuit. The mask signal receiving circuit may comprise a switch circuit interrupting a reception of the data mask signal for only a first period in synchronism with the clock signal; and a latch circuit holding a state of before being interrupted; wherein the data output circuit may mask the output data upon receiving the output control signal during the first period.

The first period may be set to a delay time shorter than a time for holding the data mask signal for the clock signal.

The mask signal receiving circuit may have a first operation mode and a second operation mode, the first operation mode being a mode for receiving the data mask signal out of synchronism, and the second operation mode being a mode for receiving the data mask signal in synchronism with the clock signal.

The semiconductor memory device may further comprise a register in which the first operation mode and the second operation mode are set. An operation mode of the mask signal receiving circuit may be generated based upon a latency data set to the register. The data output circuit may produce an output of a high-impedance state in response to the output control signal, and may mask the output data.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Prior to describing the embodiments of the present invention, first, described below with reference to the drawings are a conventional semiconductor memory device and problems associated with the conventional semiconductor memory device.

In recent years, memory devices have been designed to operate at speeds in excess of, for example, 100 MHz. There have, for example, been proposed synchronous semiconductor memory devices such as SDRAM and FCRAM (Fast Cycle RAM: registered trademark) eliminating the effect of delay due to internal clock wirings and suppressing the delay in the access time and in the dispersion, by bringing the external input clock signals into phase with the internal output clock signals by utilizing such technology as DLL (delay locked loop). These synchronous semiconductor memory devices, in general, have a burst mode.

Figure 1:
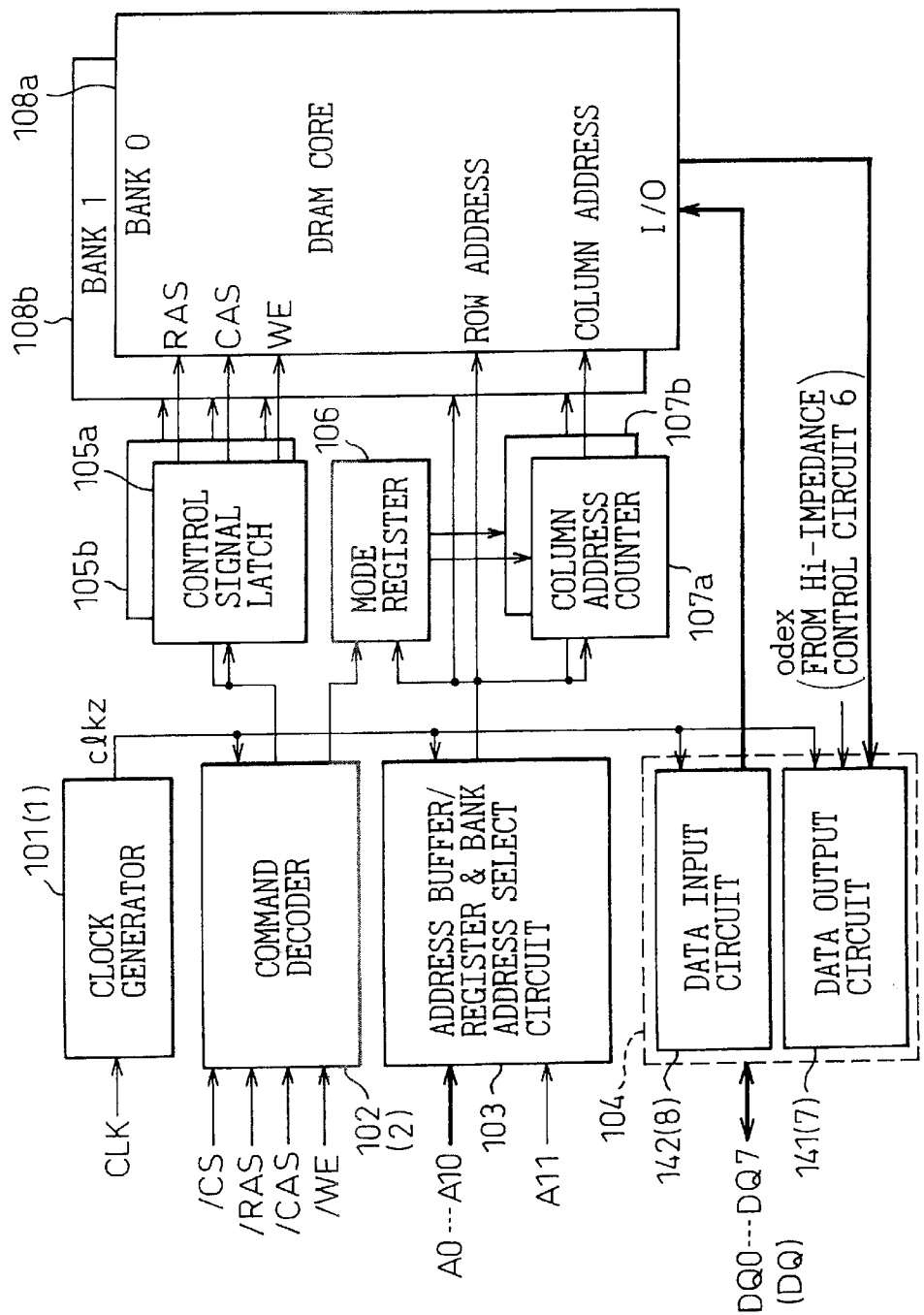
FIG. 1 is a block diagram schematically illustrating a synchronous DRAM which is a semiconductor memory device.

FIG. 1 is a block diagram schematically illustrating a synchronous DRAM (SDRAM) which is a semiconductor memory device (synchronous semiconductor memory device having a burst mode), and is constituted in two banks.

Referring to FIG. 1, the SDRAM includes, for example, a clock-generator circuit 101, a command decoder 102, an address buffer/register and bank address select circuit 103, an I/O data buffer/register 104, control signal latches 105a and 105b, a mode register 106, and column address counters 107a and 107b in addition to DRAM cores 108a and 108b of the general-purpose DRAM.

A chip select terminal (signal)/CS, a row address strobe terminal (signal)/RAS, a column address strobe terminal (signal)/CAS and a write enable terminal (signal)/WE receive various kinds of commands depending upon the combination of signals fed to these terminals, and determine the operation mode of the SDRAM. That is, the command is decoded by the command decoder 102(2) and controls the circuits depending upon the operation mode. A chip select signal (/CS), a row address strobe signal (/RAS), a column address strobe signal (/CAS) and a write enable signal (/WE) are fed to the control signal latches 105a and 105b, too, and work to latch the state until the next command is received.

Address signals A0 to A10 are fed to the DRAM cores 108a and 108b through the address buffer (address buffer/register and bank address select circuit) 103, and is, further, fed to the mode register 106 and the column address counters 107a and 107b, so as to be used as row addresses and column addresses of the banks. The address signal A11 is used for selecting the bank, i.e., bank 0 (DRAM core 108a) or bank 1 (DRAM core 108b).

The clock-generator circuit 101 forms internal clock signals clkz from the external clock signals CLK, and feeds them to the command decoder 102, address buffer/register and bank address select circuit 103, and to a data output circuit 141 and to a data input circuit 142 that will be described later. The clocks fed to the data output circuit 141 may be the dedicated clock signals obtained by correctly controlling the delay (controlling the phase) of the external clock signals CLK by using the DLL circuit, separately from the internal clock signals clkz.

The I/O data buffer/register 104 includes the data output circuit 141 (7) and the data input circuit 142 (8). Signals (output data) read out from the DRAM cores 108a and 108b are amplified into a predetermined level through the data output circuit 141, and are produced from the clock generator circuit 101 through pads DQ0 to DQ7 (DQ) at timings in compliance with the clock signals clkz. As for the input data, the data input through the pads DQ0 to DQ7 are received through the data input circuit 142, and are fed to the DRAM cores 108a and 108b. An output odex of a high-impedance control circuit 6 that will be described later is fed to the data output circuit 141 to thereby high-impedance-control (Hi-z-control) the data output circuit.

Figure 2:
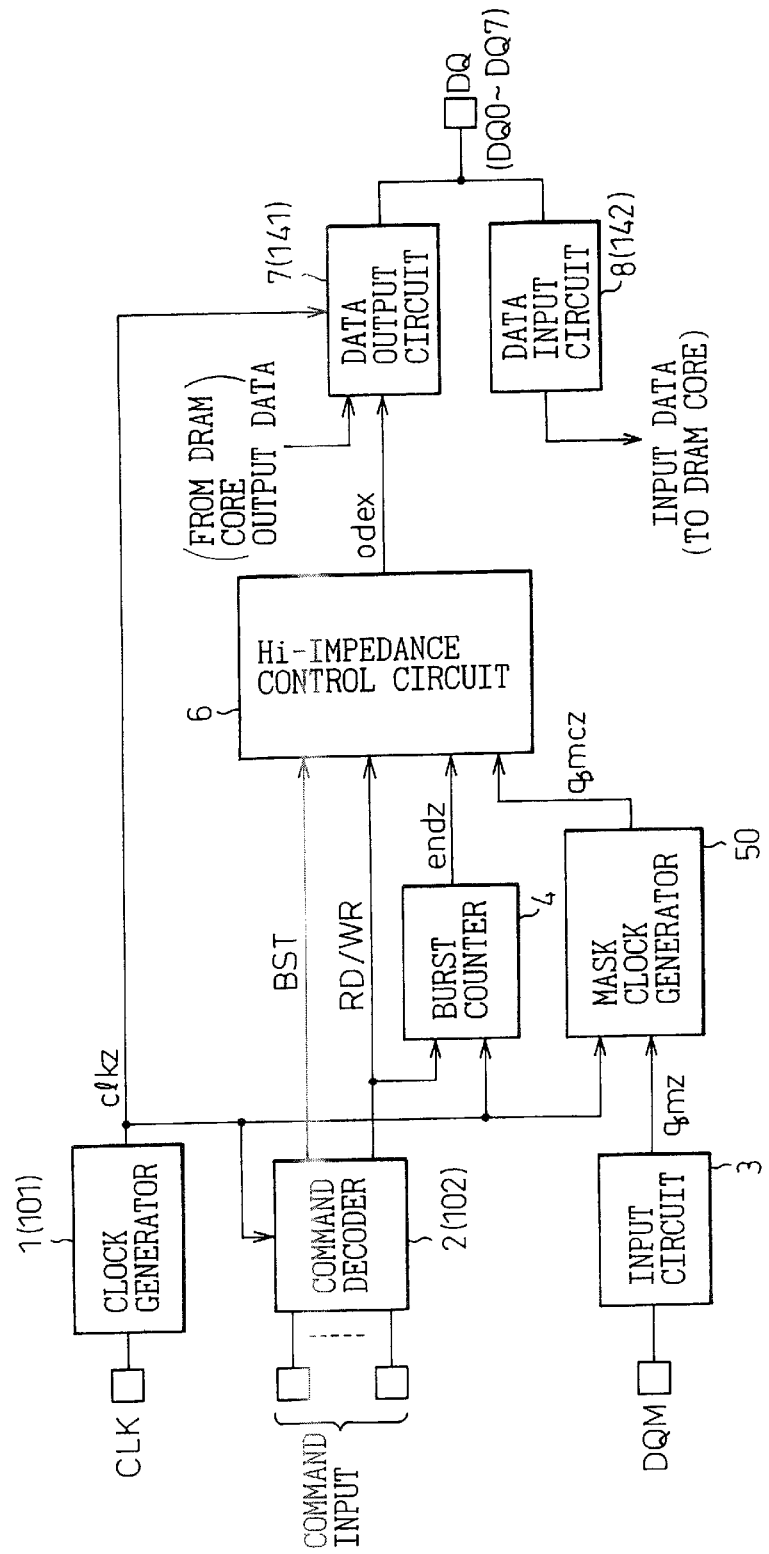
FIG. 2 is a block diagram schematically illustrating major portions of a conventional semiconductor memory device.

FIG. 2 is a block diagram schematically illustrating major portions of a conventional semiconductor memory device. In FIG. 2, reference numeral 1 denotes a clock-generator circuit (corresponds to reference numeral 101 in FIG. 1), 2 denotes a command decoder (corresponds to reference numeral 102 in FIG. 1), 3 denotes an input circuit, and 4 denotes a burst counter. Reference numeral 50 denotes a mask signal generator circuit (mask signal receiving means), 6 denotes a high-impedance control circuit, 7 denotes a data output circuit (corresponds to reference numeral 141 in FIG. 1), and reference numeral 8 denotes a data input circuit (corresponds to reference numeral 142 in FIG. 1). Further, reference numeral DQM denotes a data mask signal (mask signal pad), and DQ (DQ0 to DQ7) denotes data signals (data pads).

As shown in FIG. 2, the internal clock signals clkz output from the clock-generator circuit 1 (101) are fed to the command decoder 2, burst counter 4, mask signal generator circuit 50 and data output circuit 7. The command decoder 2 (102) receives, for example, a chip select signal (/CS), a row address strobe signal (/RAS), a column address strobe signal (/CAS) and a write enable signal (/WE), feeds a command BST (burst stop command) to the high-impedance control circuit 6, and feeds a command WR (write command) and RD (read command) to the burst counter 4 and to the high-impedance control circuit 6. The high-impedance control circuit 6 further receives an output signal (period signal of a length of burst) endz from the burst counter 4 and an output signal (internal mask signal) qmcz from the mask signal generator circuit 50. Here, the mask signal generator circuit 50 receives the internal clock signals clkz as well as an output signal qmz from the input circuit 3 that has received a data mask signal DQM from an external unit, and forms an internal mask signal qmcz.

The data output circuit 7 (141) receives output data from the DRAM cores 108a and 108b, internal clock signals clkz from the clock-generator circuit 1 and an output signal (high-impedance control signal) odex from the high-impedance control circuit 6, and produces output data to an external unit through the data pads DQ (DQ0 to DQ7). The data input circuit 8 (142) amplifies the data fed from an external unit through the data pads DQ (DQ0 to DQ7), and feeds them to the DRAM cores 108a and 108b.

Figure 3:
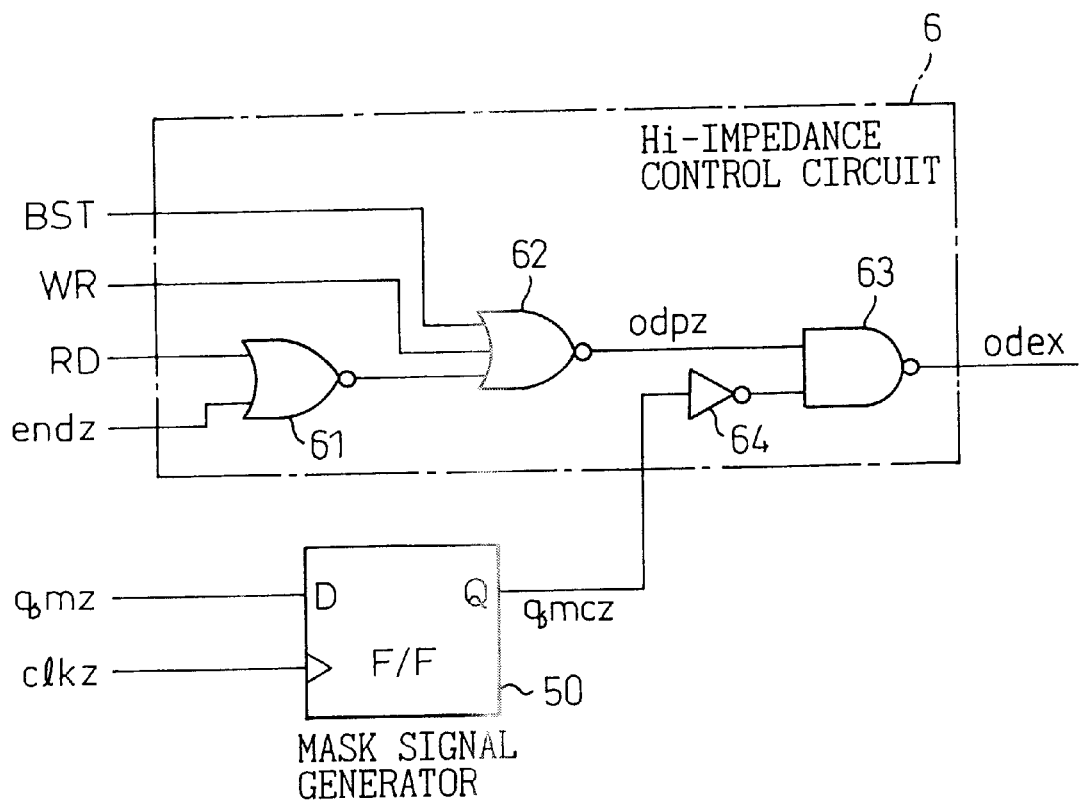
FIG. 3 is a block circuit diagram illustrating a high-impedance control circuit and a mask signal generator circuit in the semiconductor memory device of FIG. 2.
Figure 4:
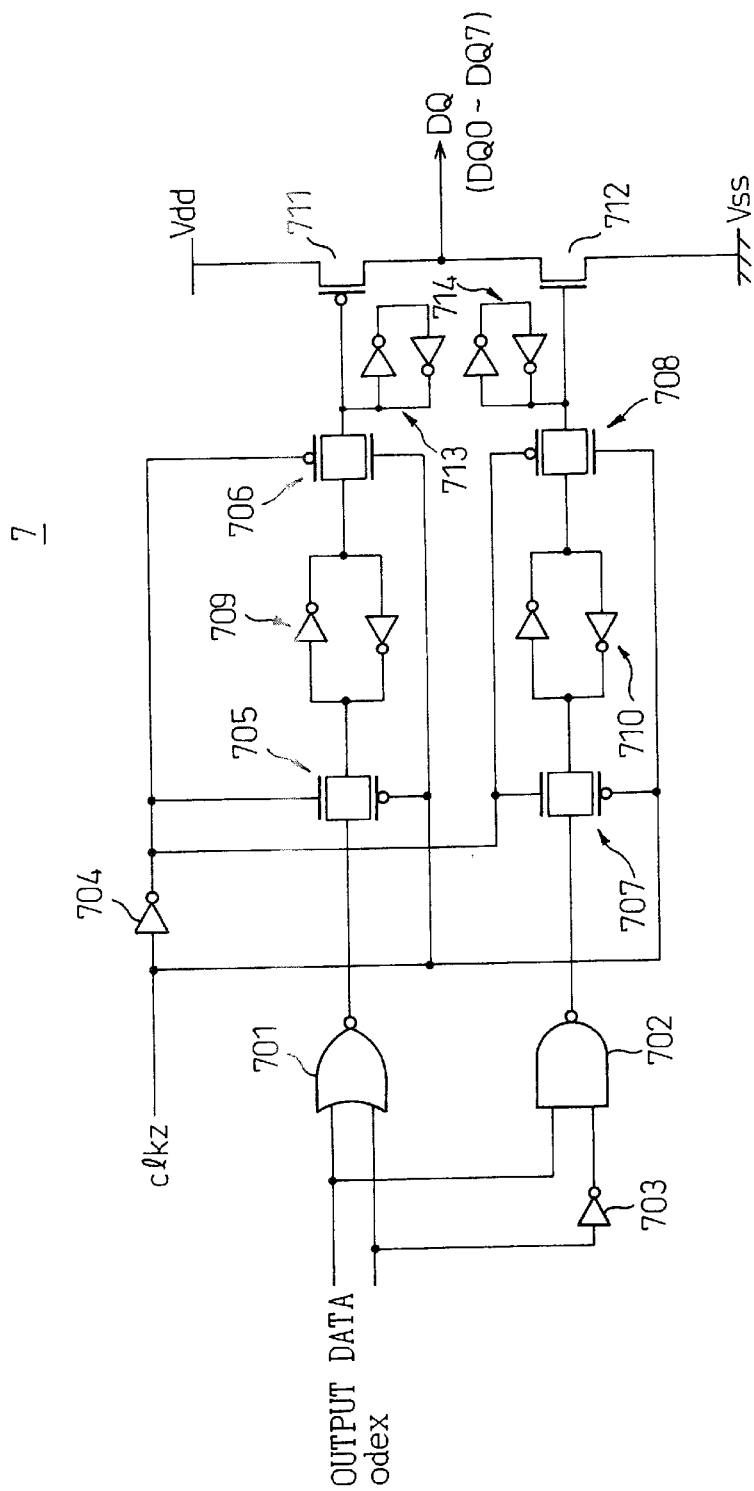
FIG. 4 is a circuit diagram illustrating a data output circuit in the semiconductor memory device of FIG. 2.

FIG. 3 is a block circuit diagram illustrating the high-impedance control circuit and the mask signal generator circuit in the semiconductor memory device of FIG. 2, and FIG. 4 is a circuit diagram illustrating the data output circuit in the semiconductor memory device of FIG. 2.

As shown in FIG. 3, the mask signal generator circuit 50 is constituted as a flip-flop, and the high-impedance control circuit 6 includes NOR gates 61 and 62, a NAND gate 63 and an inverter 64. The NOR gate 61 receives a read command RD and a period signal endz of a length of the burst, and the NOR gate 62 receives a burst stop command BST, a write command WR and an output signal from the NOR gate 61. The NAND gate 63 receives an output signal odpz of the NOR gate 62 and a signal obtained by inverting the output data qmcz of the flip-flop 50 through an inverter 64. An output of the NAND gate 63 is fed as a high-impedance control signal odex to the data output circuit 7.

Referring to FIG. 4, the data output circuit 7 includes a NOR gate 701, a NAND gate 702, inverters 703 and 704, transfer gates 705 to 708, latches 709, 710, 713, 714, and an output stage (a p-channel MOS transistor 711 and an n-channel MOS transistor 712).

The NOR gate 701 receives output data from the DRAM cores 108a and 108b and the high-impedance control signal odex from the high-impedance control circuit 6. The NAND gate 702 receives output data and a signal obtained by inverting the high-impedance control signal odex through an inverter 703. An output of the NOR gate 701 is fed to the gate of the p-channel MOS transistor 711 in the output stage through the two transfer gates 705, 706 and the latch 709 sandwiched by these transfer gates. Similarly, an output of the NAND gate 702 is fed to the gate of the n-channel MOS transistor 712 in the output stage through the two transfer gates 707, 708 and the latch 710 sandwiched by these transfer gates. The output data are taken out from a connection node between the transistors 711 and 712, and are fed to an external unit through the data pads DQ (DQ0 to DQ7). Latches 713 and 714 are provided at the connection nodes between the transfer gates 706, 708 and the gates of the transistors 711, 712, so that even when the transfer gates 706 and 708 are turned off, the gates of the transistors 711 and 712 are prevented from assuming a high-impedance state, in order to reliably execute the operation.

In the conventional semiconductor memory device as shown in FIGS. 3 and 4, the internal mask signals qmz are received by the flip-flop (mask signal generator circuit) 50 with internal clock signals clkz. Further. the high impedance of the data output circuit 7 is controlled by changing the output signal (high-impedance control signal) odex of the NAND gate 63 by using the output signal qmcz of the flip-flop 50 through the inverter 64 or by changing the output signal odpz of the NOR gate 62 by using the burst stop command BST.

In burst-reading the SDRAM (synchronous semiconductor memory device), plural data are continuously output in synchronism with the clock signals. When, for example, a write interrupt is received during the burst reading, the controller in the system receives a write command while interrupting the burst output of the SDRAM. The burst reading has heretofore been interrupted by a method of receiving data mask signals (DQM) or by a method of receiving a burst stop command (BST).

Figure 5:
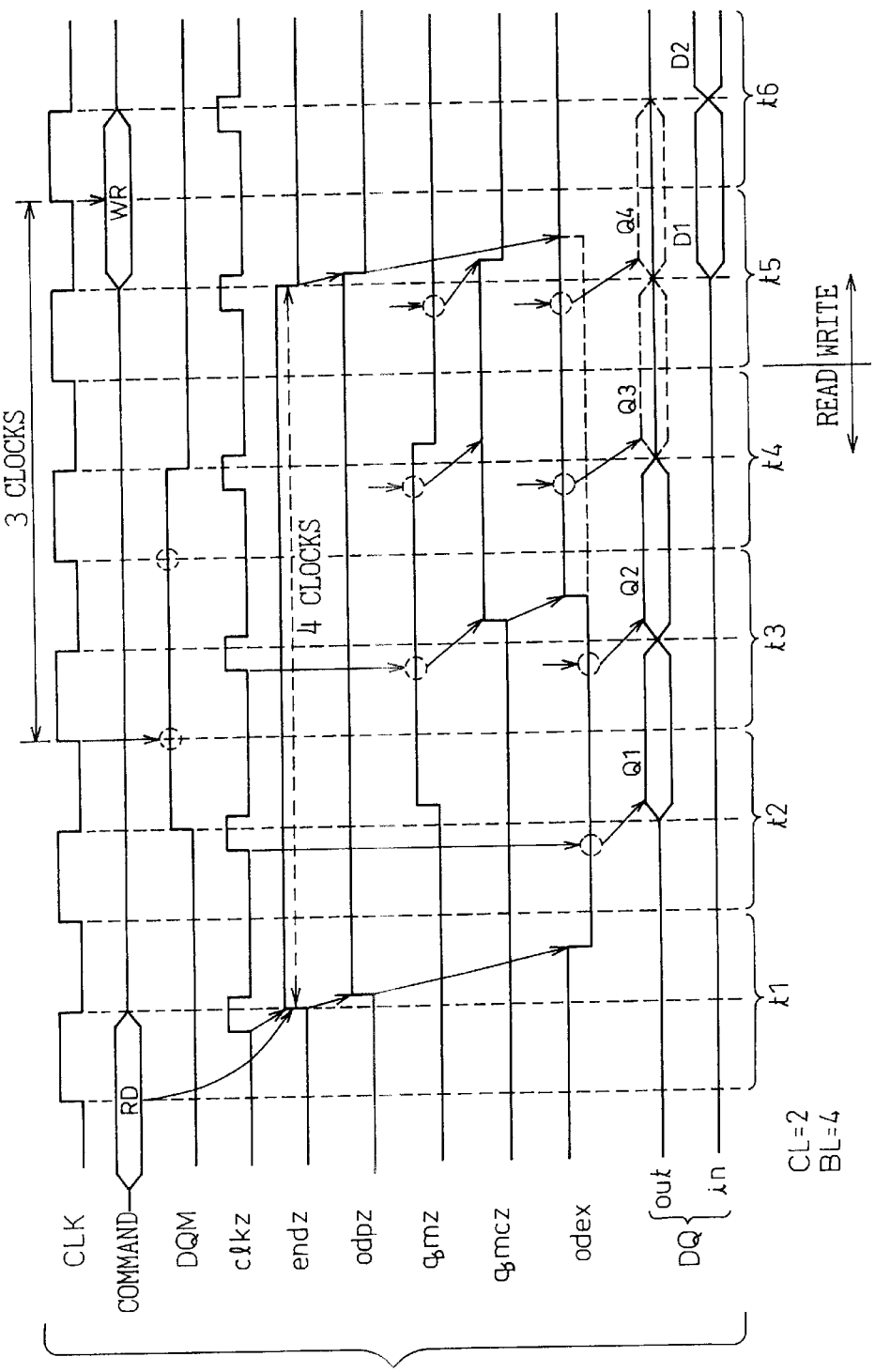
FIG. 5 is a timing diagram illustrating an example of operation of a conventional semiconductor memory device.
Figure 6:
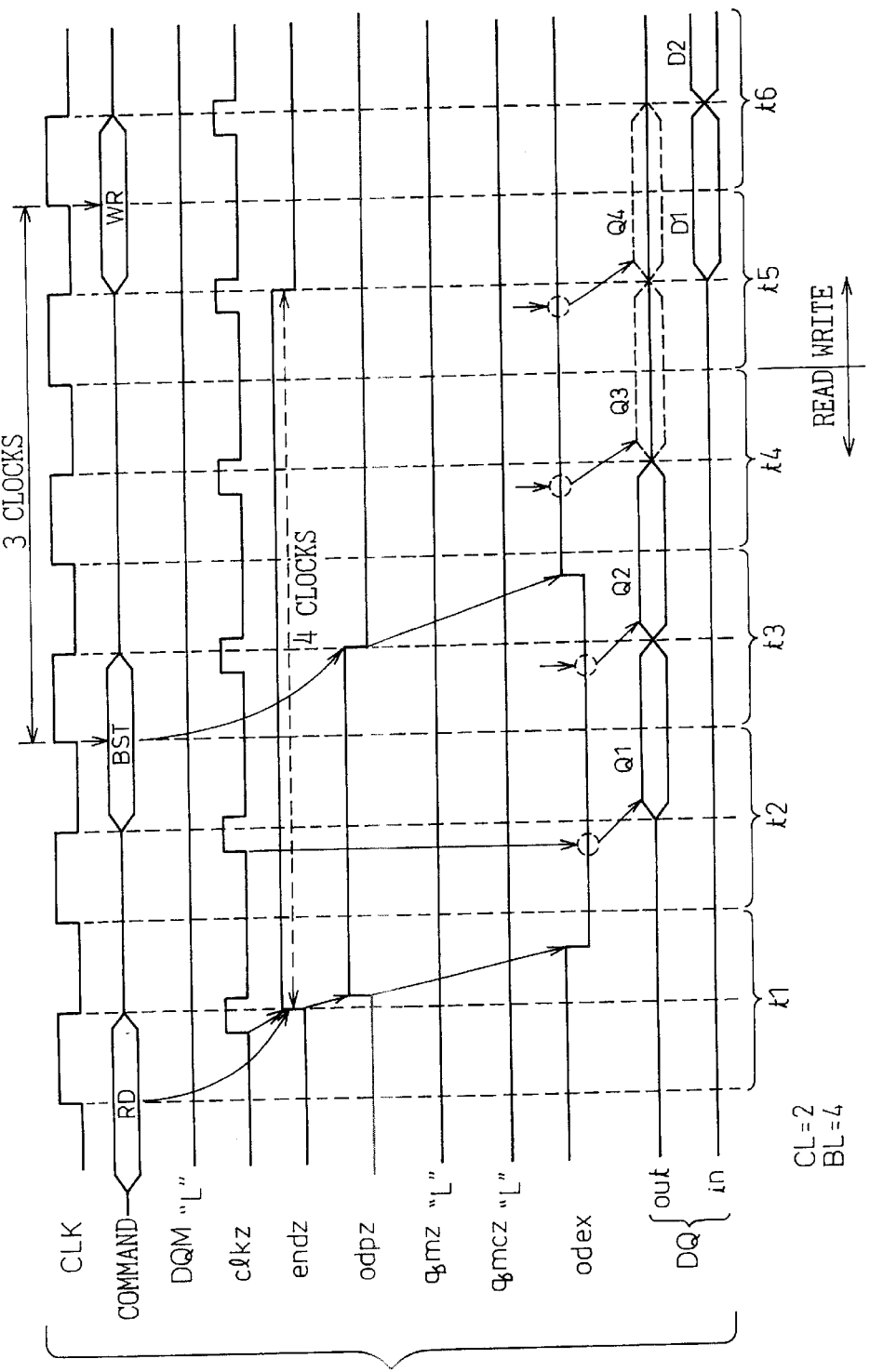
FIG. 6 is a timing diagram illustrating another example of operation of the conventional semiconductor memory device.

FIG. 5 is a timing diagram for explaining the operation of a conventional semiconductor memory device, and illustrates the operation of when the burst reading is interrupted by the data mask signal DQM. FIG. 6 is a timing diagram illustrating another operation of the conventional semiconductor memory device in the case when the burst reading is interrupted by the burst stop command BST. The operations shown in FIGS. 5 and 6 are those of a case of when the CAS latency (CL)=2 and the burst length (BL)=4.

First, when the burst reading (RD) is interrupted by the writing (WR), the data being read out must be erased in order to put the writing data (input data) onto the data bus.

As shown in FIG. 4, the read data (output data) are activated by the high-impedance control signal odex (low-level "L"). Referring to FIGS. 5 and 6, the high-impedance control signal odex changes from the high level "H" into the low level "L" in response to a read command RD, and is produced for only a period of time in which the period signal endz of the length of the burst output by the burst counter 4 remains at the high level "H" (a period of four clocks). When any one of data mask signal DQM, a burst stop command BST or a write command WR is input, the high-impedance control signal odex changes (from the low level "L" to the high level "H"), whereby the data bus (output data) assumes the high-impedance state (state in which the transistors 711 and 712 in the output stage of FIG. 4 are both off) and the reading of data is interrupted.

That is, when the output data Q3 and Q4 are to be erased among the output data (read data) Q1 to Q4, the data mask signal DQM (see FIG. 2) is input (assumes the high level "H" only for a period of two clocks), as shown in FIG. 5, at a timing t2 (central timing of the period t2). Accordingly, the output signal qmz of the input circuit 3 changes depending on the data mask signal DQM (at a timing slightly delayed behind the center of the period t2), and the output signal (internal mask signal) qmcz of the mask signal generator circuit 50 changes from the low level "L" into the high level "H" for only a period of two clocks.

As described with reference to FIG. 3, the mask signal generator circuit 50 is constituted as a flip-flop for receiving the signal qmz in synchronism with the internal clock signal clkz. Therefore, the output signal qmcz of the flip-flop 50 changes from the low level "L" into the high level "H" in a period t3 (at a timing slightly delayed behind the center of the period t3). Accordingly, the high-impedance control signal odex, too, changes from the low level "L" into the high level "H" in the period t3 (at a timing slightly delayed behind the center of the period t3). Therefore, the output data Q3 and Q4 are erased (not output onto the data bus).

In order to avoid the batting (bus fight) between the read data and the write data on the data bus, the write data D1 is input after the passage of a clock (corresponds to a period of Q3) of blank period of the bus. According to the method of interrupting the burst reading by receiving the data mask signal DQM shown in FIG. 5, a period of three clocks is necessary after the data mask signal DQM is input until the write command WR is input.

Next, when the burst reading is interrupted by receiving the burst stop command BST, as shown in FIG. 6, the burst stop command BST is input at a timing at which the output data Q1 is produced. In this case, too, like in the case of FIG. 5, a period of three clocks is necessary from when the burst stop command BST is input until when the write command WR is input. In this case, the data mask signal DQM is not input (low level "L" is maintained) and, hence, the signals qmz and qmcz are maintained at the low level "L".

That is, as shown in FIG. 3, the burst stop command SBT is fed to the input of the NOR gate 62. Upon receiving the burst stop command BST (which changes from the low level "L" to the high level "H"), the output signal odpz of the NOR gate 62 changes from the high level "H" to the low level "L" and, as a result, the high-impedance control signal odex changes from the low level "L" to the high level "H" in the period t3 (at a timing slightly delayed behind the center of the period t3). Thus, the output data Q3 and Q4 are erased. Since the write data D1 is input after the passage of a clock (corresponds to the period of Q3) of blank period of the bus, a period of three clocks is needed from when the burst stop command BST is input until when the write command WR is input.

Here, when the burst output (burst reading) is to be interrupted by the write command WR, an important point is how quickly to interrupt the data that are being burst output.

In the above-mentioned conventional semiconductor memory device, the data mask signal DQM and the burst stop command BST are received in synchronism with the clock signals. Therefore, the output timing (timing for inactivation) of the high-impedance control signal odex from the high-impedance control circuit 6 is delayed and, hence, a period of three clocks is necessary from when the data mask signal DQM or the burst stop command BST is input until when the write command WR is input. Here, when the operation is interrupted by the write processing, a delay in interrupting the burst output data permits wasteful data to be output onto the data bus and, further, causes a delay in the timing for receiving the write command WR, resulting in a decrease in the efficiency for using the data bus.

An embodiment of the semiconductor memory device according to the present invention will now be described in detail with reference to the drawings.

A semiconductor memory device according to the present invention has a function for interrupting the reading of data during the burst output in response to a data mask signal fed from an external unit, and has means for receiving the mask signals. Means for receiving the mask signals, receives the data mask signals out of synchronism, and produces asynchronous internal mask signals. By using the internal mask signal, the reading of data is interrupted during the burst output.

The semiconductor memory device may further include a data output circuit for producing read data in synchronism with the clock signals, and an output control circuit which produces output control signals upon receiving internal mask signals, and masks the output data from the data output circuit.

In order to shorten the operation time at the time of interrupting the burst reading by the write processing, either a data mask signal DQM or a burst stop command BST may be quickly transmitted to the output control circuit (high-impedance control circuit). In the present invention, the data mask signals DQM (qmz, qmcz) are quickly transmitted to the high-impedance control circuit to quickly interrupt the burst output data at the time of write interruption in order to shorten the time of from when the data mask signal DQM is input until when the write command WR is input.

Concretely speaking, the data mask signal DQM is received out of synchronism with the clock signal and is transmitted to the high-impedance control circuit in order to interrupt the output control signal odex without waiting for the clock signals, making it possible to shorten the interruption of burst output data by a period of one clock. That is, according to the present invention, the period of from the input of the data mask signal DQM until the input of the write command WR is shortened to two clocks.

Figure 7:
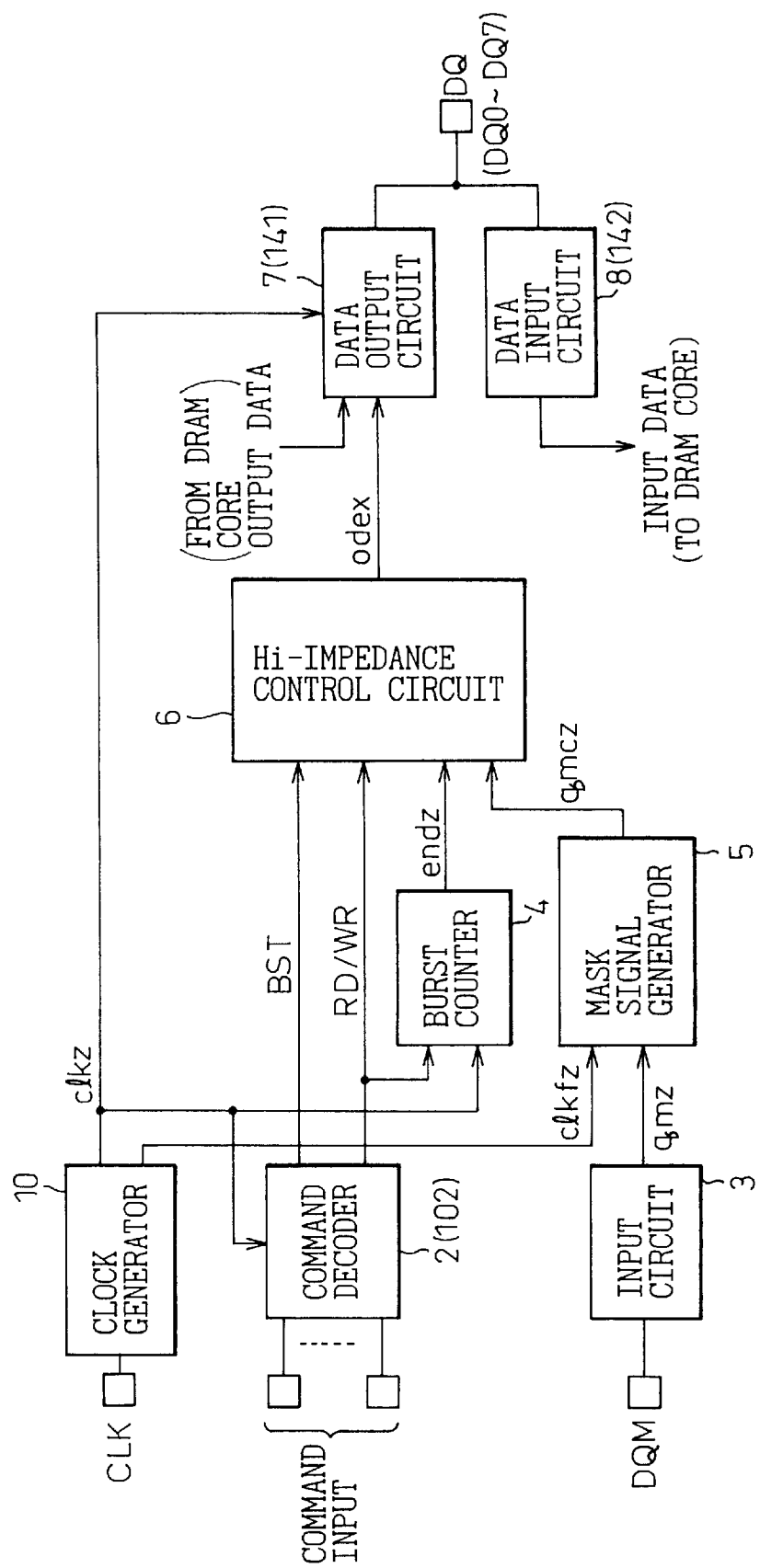
FIG. 7 is a block diagram schematically illustrating major portions of an embodiment of the semiconductor memory device according to the present invention.
Figure 8:
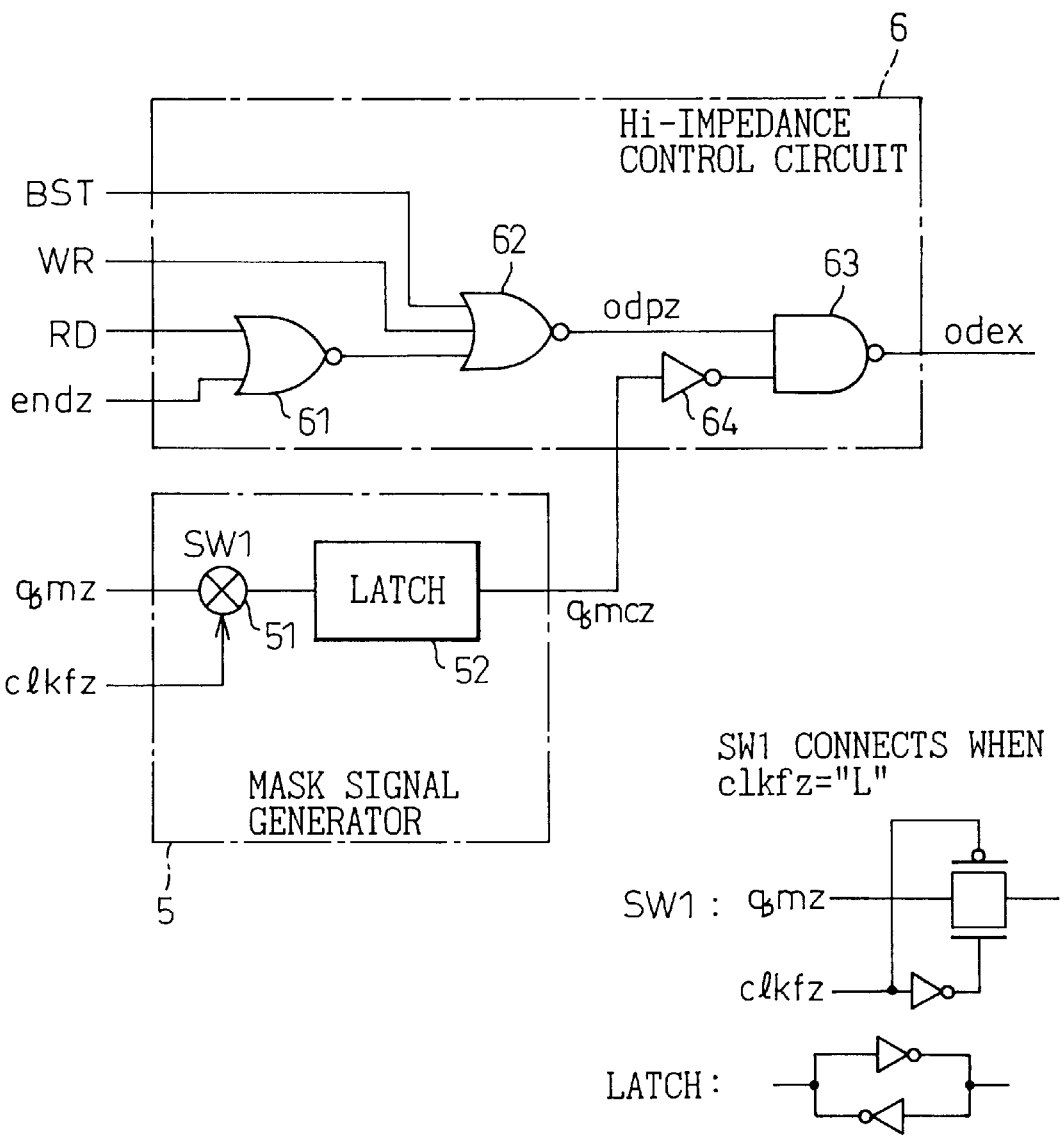
FIG. 8 is a block circuit diagram illustrating a high-impedance control circuit and a mask signal generator circuit in the semiconductor memory device of FIG. 7.

FIG. 7 is a block diagram schematically illustrating major portions of an embodiment of the semiconductor memory device according to the present invention, and FIG. 8 is a block circuit diagram illustrating the high-impedance control circuit and the mask signal generator circuit in the semiconductor memory device of FIG. 7. The embodiment shown in FIGS. 7 and 8 is different from the semiconductor memory device shown in FIGS. 2 and 3 concerning the constitution of the mask signal generator circuit (mask signal receiving means) 5 and the clock-generator circuit 10.

In FIG. 7, reference numeral 10 denotes a clock-generator circuit, 2 denotes a command decoder (corresponds to reference numeral 102 of FIG. 1), 3 denotes an input circuit, and 4 denotes a burst counter. Reference numeral 5 denotes a mask signal generator circuit, 6 denotes a high-impedance control circuit, 7 denotes a data output circuit (corresponds to reference numeral 141 in FIG. 1), and 8 denotes a data input circuit (corresponds to reference numeral 142 in FIG. 1). Further, reference symbol DQM denotes data mask signals (pads for mask signals), and DQ (DQ0 to DQ7) denote data signals (pads for data).

Here, the present invention is applied not only to the SDRAM shown in FIG. 1 but is extensively applied to the synchronous semiconductor memory devices having any other burst mode such as FCRAM. In FIG. 7, the constitutions of the command decoder 2, input circuit 3, burst counter 4, high-impedance control circuit, data output circuit 7 and data input circuit 8, are the same as those described with reference to FIG. 2, and are not described here again.

In this embodiment as shown in FIG. 8, the mask signal generator circuit 5 includes a switch 51 and a latch 52, the switch 51 being controlled by a switch control clock signal clkfz from the clock-generator circuit 10. That is, in the conventional semiconductor memory device as shown in FIG. 3, the mask signal generator circuit 50 is constituted by a flip-flop and receives the output signal qmz from the input circuit 3 at a timing corresponding to the internal clock signal clkz. According to this embodiment, however, the switch 51 is controlled by the switch control clock signal clkfz to store the output signal qmz of the input circuit 3 in the latch 52. Here, the switch 51 may be, for example, transfer gates (705 to 708) used in the data output circuit 7 of FIG. 4 and the latch 52 may be, for example, latches (709, 710) used in the data output circuit 7 of FIG. 4.

Figure 9:
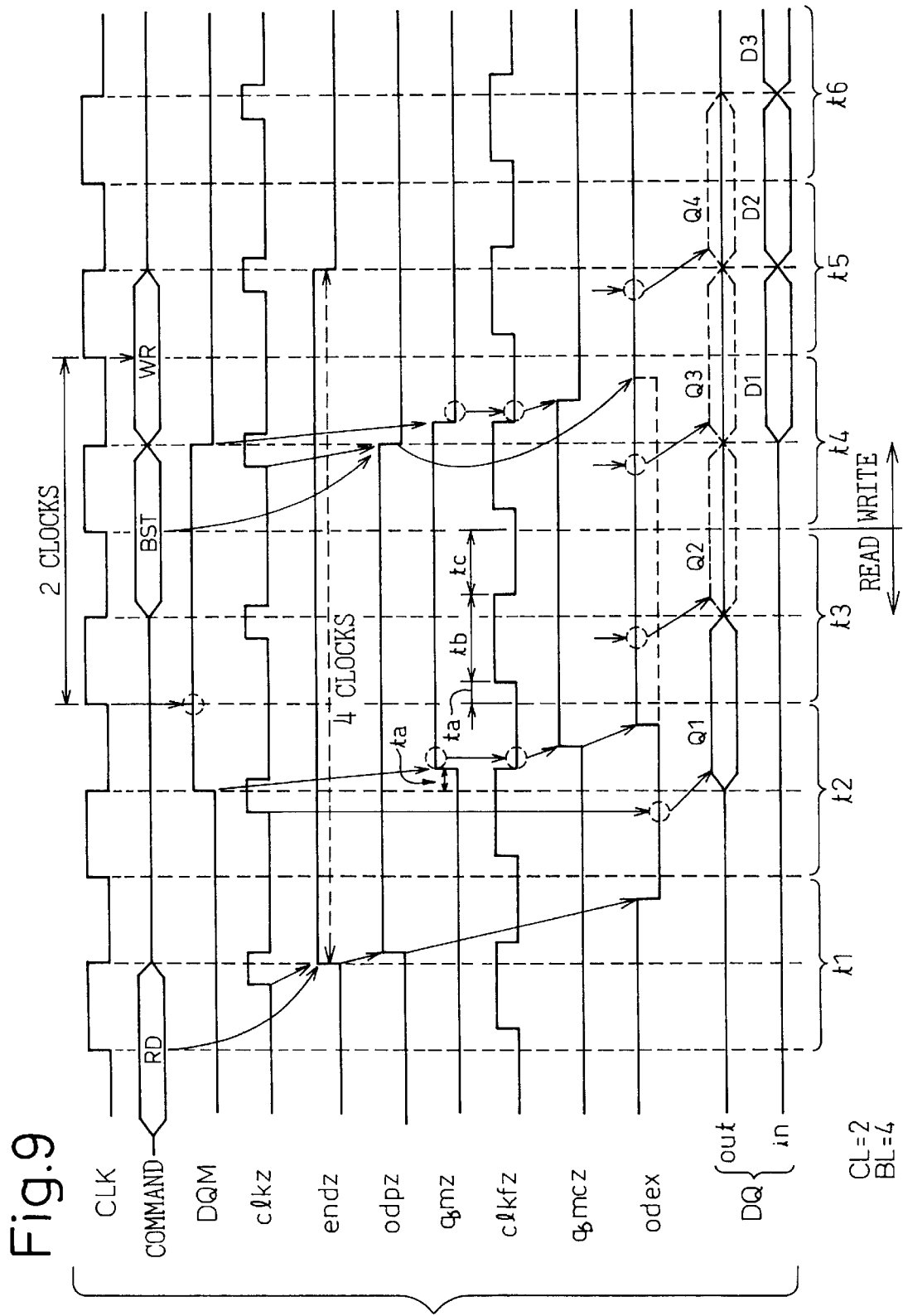
FIG. 9 is a timing diagram for illustrating an example of operation of the semiconductor memory device of FIG. 7.

FIG. 9 is a timing diagram for illustrating an operation of the semiconductor memory device of FIG. 7. The operation illustrated in FIG. 9 is of the case of when CAS latency (CL)=2 and the burst length (BL)=4. The switch 51 is turned on when clkfz assumes the low level "L".

Referring, first, to FIG. 9, when the data mask signal DQM is input (changes from the low level "L" to the high level "H"), the output signal qmz of the input circuit 3 changes (changes from the low level "L" to the high level "H") at a timing slightly delayed behind the center of the period t2. Then, upon receipt of the switch control clock signal clkfz that has broken from the high level "H" down to the low level "L", the switch 51 is connected and whereby a signal qmz of the high level "H" is transmitted to the latch 52, and the output signal (internal mask signal) qmcz of the latch 52 changes from the low level "L" to the high level "H" in the period t2. The internal mask signal qmcz of the high level "H" is inverted through the inverter 64, a signal of the low level "L" is fed to the NAND gate 63 and, as a result, the output signal (high-impedance control signal) odex of the NAND gate 63 changes from the low level "L" to the high level "H" in the period t2. Accordingly, the output data Q3 and Q4 are erased. Here, as will be obvious from the comparison of FIG. 9 with FIG. 5 described above, this embodiment needs a period of only two clocks from when the data mask signal DQM is input until when the write command WR is input.

That is, in this embodiment, the high-impedance control signal odex can be changed in the clock period (t2) which is the same as the one in which the data mask signal DQM was input, making it possible to input the write command WR in a period shorter by one clock period than the one of when the mask signal generator circuit is constituted by the flip-flop 50 as shown in FIG. 3.

Here, as shown in FIG. 9, the mask signal generator circuit 5 shown in FIG. 8 receives the data mask signal DQM in a period ta in which the switch control clock signal clkfz assumes the low level "L", and holds it in a period tb in which the switch control clock signal clkfz assumes the high level "H". The switch control clock signal clkfz is formed by delaying the clock signal CLK fed from the external unit.

That is, the period ta of from when the external clock signal CLK rises until when the switch control clock signal clkfz rises, is set to be a delay time shorter than the time for holding the data mask signal DQM (qmz) for the external clock signal CLK. Further, the period tb for holding by the latch 52 by interrupting the input of data mask signal DQM (qmz) is determined by a relationship to the internal clock signal clkz. Namely, in the embodiment of FIG. 9, the period tb in which the switch control clock signal clkfz assumes the high level "H", includes a period in which the internal clock signal clkz assumes the high level "H". In this embodiment, therefore, the high-impedance control circuit 6 generates a high-impedance control signal odex out of synchronism in response to the mask signal (internal mask signal) qmcz that is latched.

When the output data sent from the memory array (DRAM core) are produced in synchronism with the internal clock signals clkz as described with reference to FIG. 4, the data output circuit 7 controls whether the data be produced or not (produced or masked) depending upon the high-impedance control signal odex. When the internal clock signals clkz are being generated (during the period of the high level "H"), therefore, the input of data mask signal DQM is interrupted so that the high-impedance control signal odex will not change, i.e., so that the internal mask signal qmcz will not change. Here, it needs not be pointed out that the data output circuit 7 is not limited to the circuit of FIG. 4 but can be constituted in a variety of ways.

After the period tb, the switch control clock signal clkfz changes from the high level "H" to the low level "L", and the mask signal generator circuit 5 receives the data mask signals DQM (qmz) out of synchronism. Here, the data mask signal DQM is input preceding the external clock signal CLK by a setup time. By rendering the switch control clock signal clkfz to assume the low level "L" in the clock period, therefore, the data mask signal DQM (qmz) can be received earlier than the clock signal by the setup time, and can be transmitted to the high-impedance control circuit 6, enabling the output data generated by the internal clock signal clkz in the clock period to be masked by the high-impedance control signal odex.

In the timing diagram of FIG. 9, the data mask signal DQM is input in the period t3, and the data mask signal DQM and the burst stop command BST are input in the period t4. This is to erase the output data Q2 and Q3 by the data mask signal DQM and, further, to erase the output data Q4 by the burst stop command BST. This is because, when it is attempted to erase the output data Q4 by the data mask signal DQM, the data mask signal DQM is input simultaneously with the write command WR; i.e., the data mask signal DQM input at that timing erases the write data D1. That is, in the embodiment shown in FIG. 9, the output data Q4 cannot be erased by the data mask signal DQM and is, hence, erased by the burst stop command BST. In the period t3, further, the data mask signal DQM and the burst stop command BST may be input simultaneously, the output data Q2 may be erased by the data mask signal DQM, and the output data Q3 and Q4 may be erased by the burst stop command BST.

Figure 10:
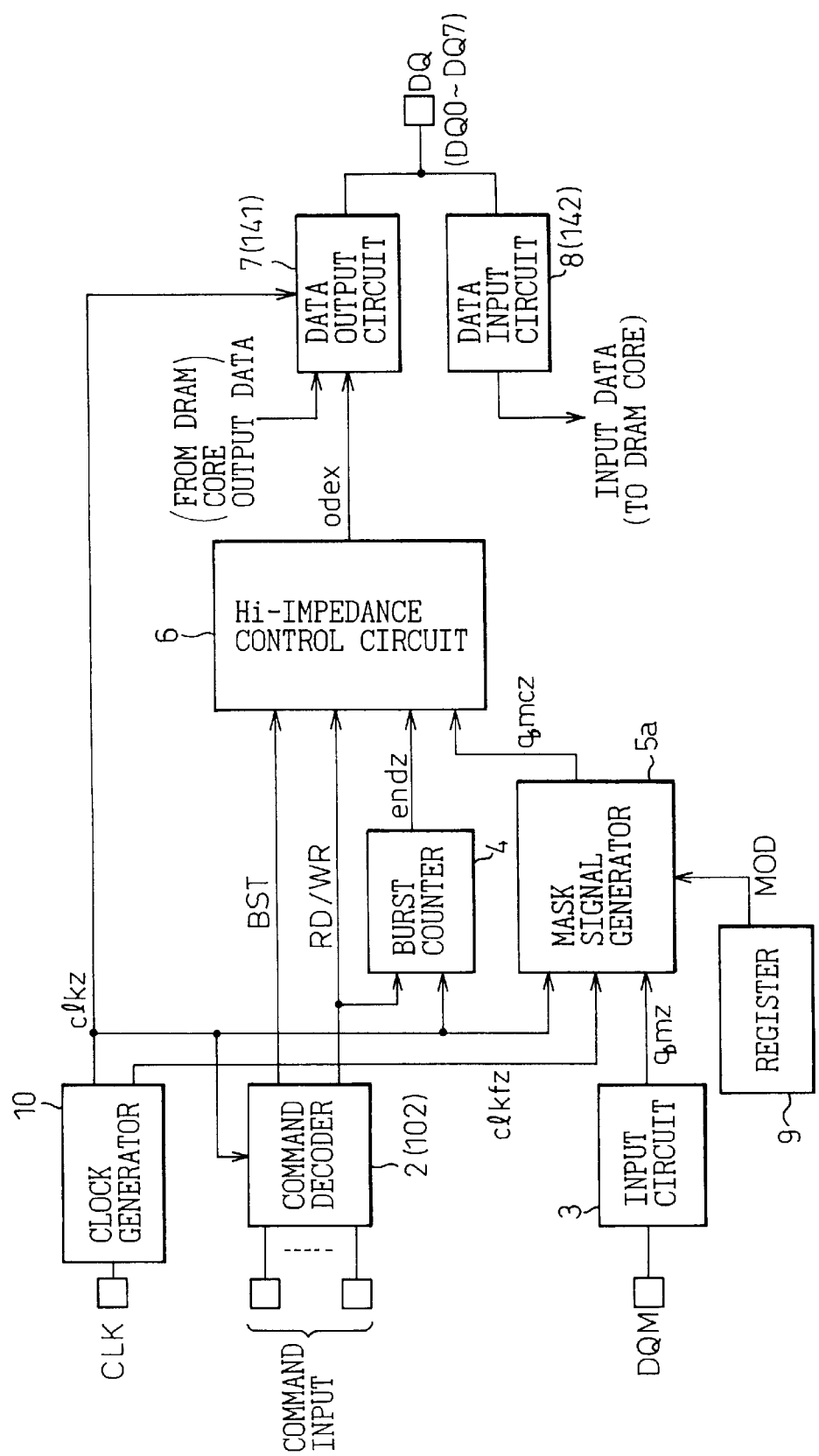
FIG. 10 is a block diagram schematically illustrating major portions of another embodiment of the semiconductor memory device according to the present invention.
Figure 11:
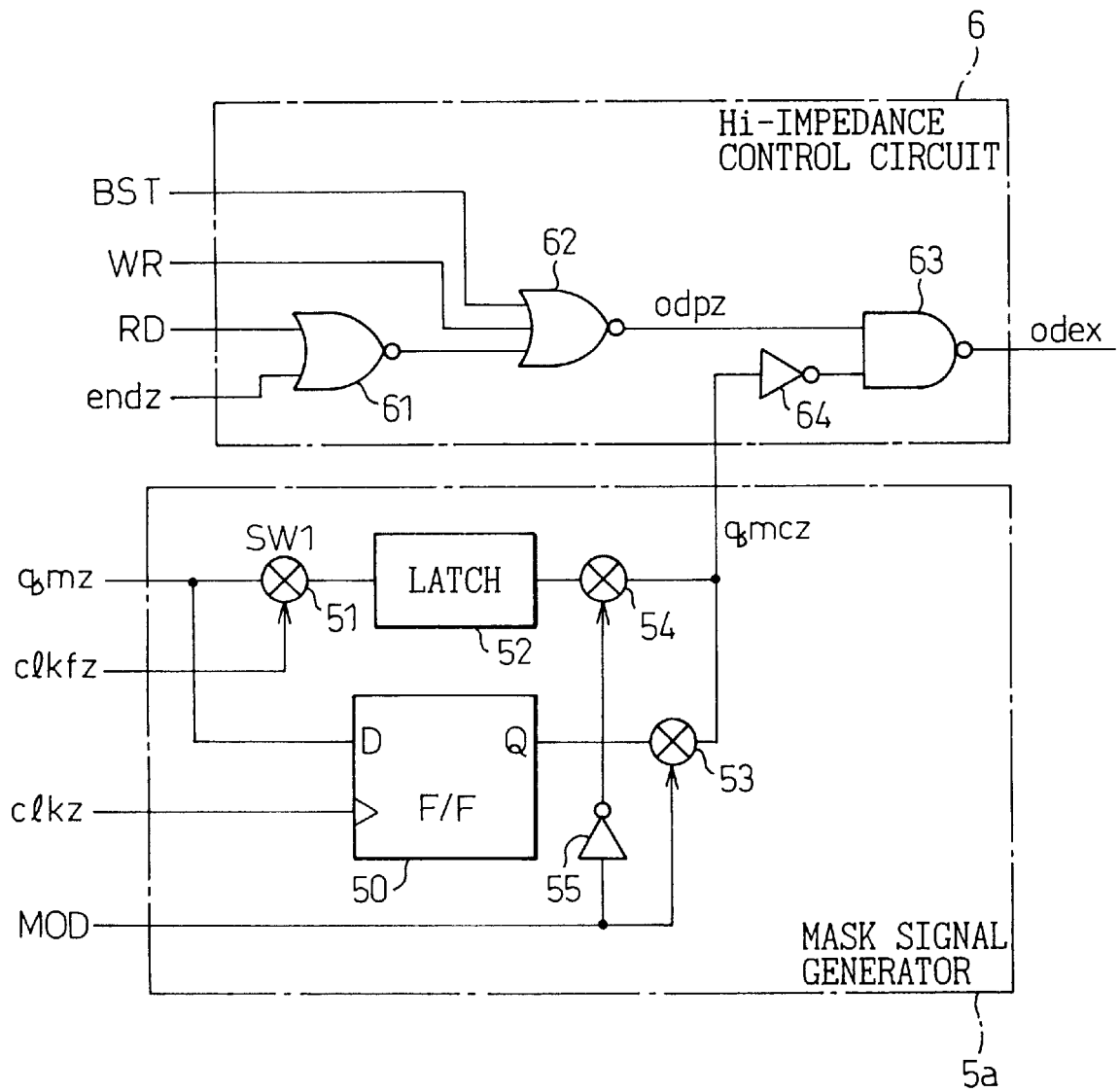
FIG. 11 is a block circuit diagram illustrating a high-impedance control circuit and a mask signal generator circuit in the semiconductor memory device of FIG. 10.

FIG. 10 is a block diagram schematically illustrating major portions of the semiconductor memory device according to another embodiment of the present invention, and FIG. 11 is a block circuit diagram illustrating a high-impedance control circuit and a mask signal generator circuit in the semiconductor memory device of FIG. 10.

The embodiment shown in FIGS. 10 and 11 is the one which enables the embodiment described with reference to FIGS. 7 to 9 to be changed over to the conventional constitution. That is, as will be obvious from the comparison of FIGS. 10 and 11 with FIGS. 7 and 8, the second embodiment is the one in which a register 9 is added to the above-mentioned first embodiment in order to determine the function of the mask signal generator circuit (mask signal receiving means) 5a according to a setting mode stored in the register 9.

Referring to FIG. 11, the mask signal generator circuit 5a includes a flip-flop 50 corresponding to the conventional mask signal generator circuit shown in FIG. 3, a switch 51 and a latch 52 constituting the mask signal generator circuit (5) of the first embodiment shown in FIG. 8, switches 53 and 54 for selecting either an output signal of the flip-flop 50 or an output signal of the latch 52, and an inverter 55.

Concretely speaking, when the mode signal MOD stored in the register 9 has the high level "H", the switch 53 is turned off, the switch 54 is turned on, and the mask signal generator circuit 5a assumes the same constitution as that of the first embodiment shown in FIG. 8. Conversely, when the mode signal MOD has the low level "L", the switch 53 is turned on, the switch 54 is turned off, and the mask signal generator circuit 5a assumes the same constitution as that of the prior art shown in FIG. 3.

Thus, the mask signal generator circuit 5a is constituted in the same manner as the conventional mask signal generator circuit (flip-flop) 50 shown in FIG. 3 because of the reason that some users may not desire enhanced operation speed but may desire the specifications for receiving the command WR after the period of three clocks from when the data mask signal DQM or the burst stop command BST was input. Instead of providing the register 9, further, the circuit may be so constituted as to set the testing relying upon a fuse circuit or may be so constituted as can be sorted by masking the wiring layer at the time of production by masking option.

When the operation mode is set by the register 9, the circuit may be so constituted as to generate a mode signal (change-over signal) MOD upon setting a particular CAS latency (CL) in the mode register. Then, the mode for receiving the data mask signal DQM can be changed depending upon the CAS latency that is set.

Here, in FIG. 9, the burst stop command BST is input to erase the output data Q4. When a case of CAS latency (CL)=1 is taken into consideration, for example, the output data A1 to Q4 of data pads (data buses) DQ are produced being shifted forward by one clock, respectively. That is, the output data Q4 of the case of CL=1 is produced at a position of the output data Q3 of the case of CL=2, and the output data Q4, too, can be erased by the data mask signal DQM. In the case of CL=1, therefore, there is no need of receiving the burst stop command BST. When it is desired to avoid cumbersome operation of receiving both the burst stop command BST and the data mask signal DQM, the data mask signal DQM (qmz) may be received out of synchronism only when, for example, CL=1.

According to the semiconductor memory device of the present invention as described above in detail, the operation time is shortened when the burst reading is interrupted by the write processing, in order to enhance the efficiency for using the data bus and to further increase the speed of operation.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory device having a function for interrupting a reading of data during a burst output in response to a data mask signal fed from a external unit, comprising:

a mask signal receiving circuit receiving said data mask signal out of synchronism with an internal clock signal and producing an asynchronous internal mask signal;

wherein the reading of data during said burst output is interrupted by using said internal mask signal.

2. The semiconductor memory device as claimed in claim 1, further comprising a data output circuit producing read data in synchronism with a clock signal, and an output control circuit producing an output control signal upon receiving said internal mask signal and masking the output data from said data output circuit.

3. The semiconductor memory device as claimed in claim 2, wherein said mask signal receiving circuit comprises:
 a switch circuit interrupting a reception of said data mask signal for only a first period in synchronism with said clock signal; and
 a latch circuit holding a state of before being interrupted;
 wherein said data output circuit masks the output data upon receiving said output control signal during said first period.

4. The semiconductor memory device as claimed in claim 3, wherein said first period is set to a delay time shorter than a time for holding said data mask signal for said clock signal.

5. The semiconductor memory device as claimed in claim 4, wherein said mask signal receiving circuit has a first operation mode and a second operation mode, the first operation mode being a mode for receiving said data mask signal out of synchronism, and said second operation mode being a mode for receiving said data mask signal in synchronism with said clock signal.

6. The semiconductor memory device as claimed in claim 5, further comprising a register in which said first operation mode and said second operation mode are set.

7. The semiconductor memory device as claimed in claim 6, wherein an operation mode of said mask signal receiving circuit is generated based upon a latency data set to said register.

8. The semiconductor memory device as claimed in claim 2, wherein said data output circuit produces an output of a high-impedance state in response to said output control signal, and masks said output data.

* * * * *